(12) United States Patent
Wu

(10) Patent No.: US 8,890,123 B2
(45) Date of Patent: *Nov. 18, 2014

(54) SEMICONDUCTOR COMPOSITION INCLUDING A SEMICONDUCTING POLYMER

(75) Inventor: Yiliang Wu, Oakville (CA)

(73) Assignee: Samsung Electronics Co. Ltd., Gyeonggi-Do (KR)

( * ) Notice: Subject to any disclaimer, the term of this patent is extended or adjusted under 35 U.S.C. 154(b) by 362 days.

This patent is subject to a terminal disclaimer.

(21) Appl. No.: 13/011,139

(22) Filed: Jan. 21, 2011

(65) Prior Publication Data

US 2012/0187380 A1    Jul. 26, 2012

(51) Int. Cl.

| | |
|---|---|
| *H01L 51/30* | (2006.01) |
| *H01B 1/14* | (2006.01) |
| *B82Y 30/00* | (2011.01) |
| *B82Y 40/00* | (2011.01) |
| *H01L 51/10* | (2006.01) |
| *H01L 51/40* | (2006.01) |
| *H01L 51/00* | (2006.01) |
| *B82Y 10/00* | (2011.01) |
| *H01L 51/05* | (2006.01) |

(52) U.S. Cl.
CPC ........ *H01L 51/0048* (2013.01); *H01L 51/0036* (2013.01); *H01L 51/0566* (2013.01); *B82Y 10/00* (2013.01); *Y10S 977/742* (2013.01); *Y10S 977/75* (2013.01)
USPC .............. 257/40; 257/E51.001; 257/E51.005; 257/E51.027; 252/511; 977/742; 977/750

(58) Field of Classification Search
None
See application file for complete search history.

(56) References Cited

U.S. PATENT DOCUMENTS

| | | | |
|---|---|---|---|
| 7,875,878 B2 * | 1/2011 | Wu et al. .......................... | 257/40 |
| 2008/0234424 A1 * | 9/2008 | Lee et al. ....................... | 524/495 |
| 2009/0140237 A1 | 6/2009 | Wu et al. | |

FOREIGN PATENT DOCUMENTS

JP      2006222251 A  *  8/2006

OTHER PUBLICATIONS

Machine translation of JP2006-222251. Date of publication: Aug. 24, 2006.*

* cited by examiner

*Primary Examiner* — Andrew K Bohaty

(74) *Attorney, Agent, or Firm* — Harness, Dickey & Pierce, P.L.C.

(57) ABSTRACT

A thin film transistor has a semiconducting layer comprising a polythiophene and carbon nanotubes. The semiconducting layer exhibits high mobility and high current on/off ratio.

13 Claims, 2 Drawing Sheets

SEMICONDUCTOR COMPOSITION INCLUDING A SEMICONDUCTING POLYMER

BACKGROUND

The present disclosure relates to thin-film transistors (TFTs) and/or other electronic devices comprising a semiconducting layer. The semiconducting layer is formed from a semiconductor composition as described herein. When the composition is used in the semiconducting layer of a device, high mobility and excellent stability may be achieved.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio of the overall transistor. High mobility and high on/off ratio are desired.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like. To enable the use of these solution-based processes in fabricating thin-film transistor circuits, solution processable materials are therefore required. However, organic or polymeric semiconductors formed by solution processing tend to suffer from limited solubility, air sensitivity, and especially low field-effect mobility. This poor performance may be attributable to the poor film-forming nature of small molecules.

It would be desirable to develop semiconducting compounds that exhibit high field effect mobility and good film-forming properties.

BRIEF DESCRIPTION

The present application discloses, in various embodiments, semiconductor compositions comprising a semiconducting polymer and carbon nanotubes. These compositions exhibit high mobility and good on/off ratio performance.

Disclosed in embodiments is a semiconductor composition comprising a liquid, carbon nanotubes, and a semiconducting polymer. the semiconducting polymer is capable of forming polymer aggregates in the liquid at room temperature. The carbon nanotubes can be stabilized by the semiconducting polymer or the polymer aggregates.

The composition may have a shelf-life of greater than one week.

In embodiments, the semiconducting polymer is less than 2.0 wt % of the composition, and the carbon nanotubes are from about 1 to about 50 wt % of the semiconducting polymer. In further embodiments, the carbon nanotubes are present in an amount of from about 10 to about 50 wt % of the total weight of the semiconducting polymer and the carbon nanotubes. The weight ratio of carbon nanotubes to semiconducting polymer may be, more specifically, from about 10:90 to about 50:50.

Also disclosed in embodiments is a semiconductor composition comprising carbon nanotubes and a polythiophene of Formula (I):

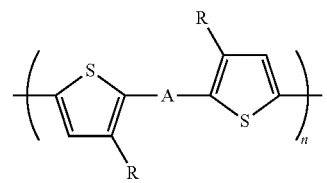

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000.

R may be alkyl having from about 6 to about 25 carbon atoms. In some embodiments, the alkyl has from about 10 to about 16 carbon atoms.

The carbon nanotubes may be surface-modified carbon nanotubes. In some embodiments, the carbon nanotubes are single-wall semiconducting carbon nanotubes.

The weight ratio of the carbon nanotubes to the polythiophene may be from about 1:99 to about 50:50.

The polythiophene may have the structure of Formula (II):

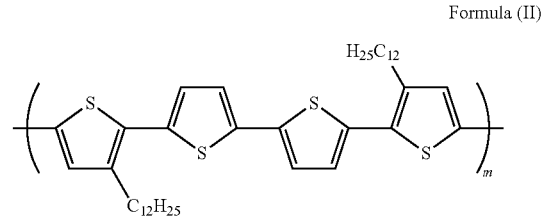

Formula (II)

wherein m is from 2 to about 2,500.

Also disclosed are processes for producing semiconductor compositions comprising a polythiophene and carbon nanotubes. The processes include dispersing the carbon nanotubes and a first amount of the polythiophene in a solvent to form a first dispersion; adding a second amount of the polythiophene to the dispersion to form a loaded dispersion; and dispersing the second amount of the polythiophene in the loaded dispersion to form a second dispersion. Other processes comprise dispersing the carbon nanotubes and a first amount of a first semiconducting polymer in a liquid to form a first dispersion; adding a second amount of a second semiconductor to the first dispersion to form a loaded dispersion; and dispersing or dissolving the second semiconductor in performing a second dispersing step on the loaded dispersion to form a final dispersion; wherein the first semiconducting polymer is capable of forming polymer aggregates in the liquid.

In some embodiments, the first semiconducting polymer is a polythiophene having the structure of Formula (I):

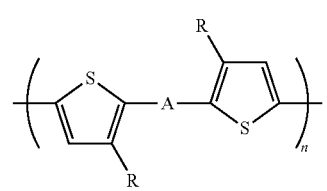

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000.

The weight ratio of the carbon nanotubes to the first semiconducting polymer in the first dispersion may be from about 10:90 to about 50:50.

In some embodiments, the weight ratio of the carbon nanotubes to the sum of the first semiconducting polymer and the second semiconductor in the loaded dispersion is from about 1:99 to about 20:80. Sometimes, the second semiconductor is also a semiconducting polymer. The second semiconducting polymer may also be of Formula (I), and may be the same as the first semiconducting polymer.

The first dispersion can be formed by using a probe sonication, and the final dispersion can be formed by using a bath sonication.

The second semiconducting polymer may be added to the first dispersion in different ways. The second semiconducting polymer be added to the first dispersion by mixing the first dispersion with a second dispersion comprising the second semiconducting polymer. In other embodiments, the second semiconducting polymer is added to the first dispersion in powder form. The first dispersion is then heated to dissolve the second semiconducting polymer to form the loaded dispersion.

Electronic devices comprising the semiconductor compositions are also disclosed. The electronic devices may be TFTs. The electronic devices comprise a semiconducting layer, the semiconducting layer comprising carbon nanotubes and a polythiophene of Formula (I). The carbon nanotubes can be present in an amount of at least 10 wt % of the polythiophene.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
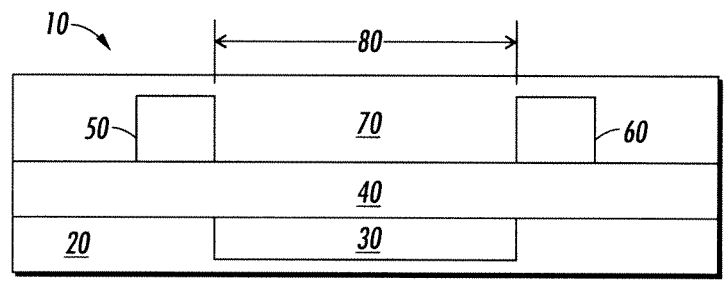
FIG. 1 is a diagram of a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of" which allows the presence of only the named component, along with any impurities that might result from the manufacture of the named component.

The term "room temperature" refers to a temperature in the range of 20° C. to 25° C.

The present disclosure relates to semiconductor compositions comprising a semiconducting polymer (such as a polythiophene) and carbon nanotubes. Processes for producing the compositions and electronic devices containing semiconducting layers which include the compositions are also disclosed.

The semiconductor compositions, in embodiments, have a shelf-life of greater than one week, including greater than 1 month, or greater than 3 months. The term "shelf-life" refers to the length of time the semiconductor composition can be stored without becoming unsuitable for use. There should be no significant changes in the chemical or physical properties of the composition. In embodiments, there is no precipitation of the carbon nanotubes upon storage.

FIG. 1 illustrates a bottom-gate bottom-contact TFT configuration according to the present disclosure. The TFT 10 comprises a substrate 20 in contact with the gate electrode 30 and a gate dielectric layer 40. The gate electrode 30 is depicted here in a depression within the substrate 20, but the gate electrode could also be located atop the substrate. It is important that the gate dielectric layer 40 separates the gate electrode 30 from the source electrode 50, drain electrode 60, and the semiconducting layer 70. The semiconducting layer 70 runs over and between the source and drain electrodes 50 and 60. The semiconductor has a channel length 80 between the source and drain electrodes 50 and 60.

Figure 2:
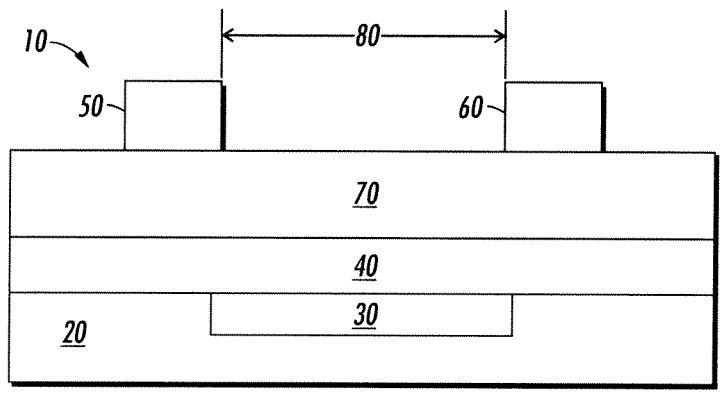
FIG. 2 is a diagram of a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting layer 70 is placed on top of the gate dielectric layer 40 and separates it from the source and drain electrodes 50 and 60.

Figure 3:
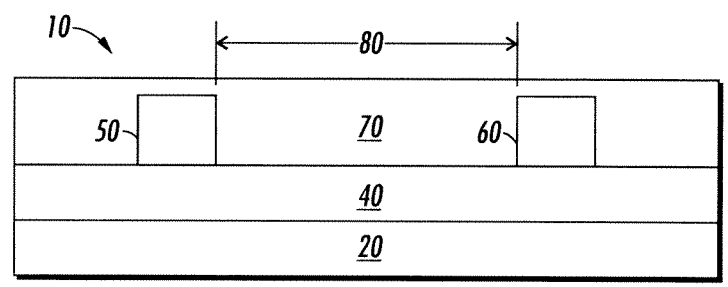
FIG. 3 is a diagram of a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting layer 70 are located atop the gate dielectric layer 40.

Figure 4:
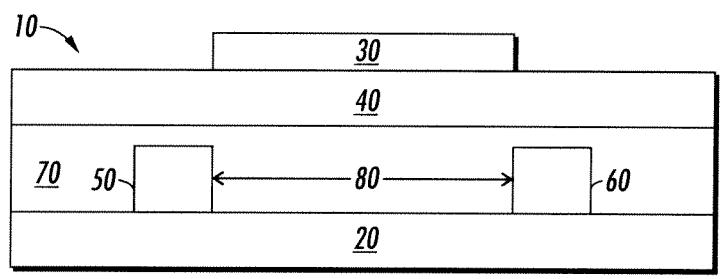
FIG. 4 is a diagram of a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70.

The semiconductor composition of the present disclosure comprises a liquid. The liquid is one in which a semiconducting polymer and carbon nanotubes can be dissolved or dispersed. Exemplary liquids include water, alcohol, acetate; aromatic hydrocarbons such as toluene, xylene, tetrahydronaphthalene, methy-naphthalene, and mesitylene; aliphatic hydrocarbons such as hexane, decalin, and cyclohexane; chlorinated solvents such as chlorobenezene, dichlorobenzene, trichlorobenzene, and chlorotoluene; fluorinated solvents such as hexafluoropropanol, perfluorodecalin, perfluorocyclohexane, and perfluorononane; ketones such as acetone and methyl ethyl ketone; and mixtures thereof. In embodiments, the liquid is a chlorinated solvent or a fluorinated solvent.

The semiconductor composition of the present disclosure also comprises a semiconducting polymer which is capable of forming polymer aggregates. The term "polymer aggregates" refers to the ability of the polymer to form discrete particles or clusters of polymer molecules rather than a dissolved individual molecular chain. Such particles have a diameter of from about a few nanometers to about a few micrometers. In embodiments, the semiconducting polymer is a conjugated polymer, the conjugated polymer aggregates having a particle size from about 5 nanometers to about 1 micrometer, including from about 5 nanometers to about 500 nm, as determined using a light scattering method. Exemplary semiconducting polymers that can form polymer aggregates include polythiophenes as discussed herein, polyindolocarbazoles, poly (phenylene vinylene), and the like.

In embodiments, the polymer can form stable aggregates at room temperature in the liquid. A variety of processes can be used to form the polymer aggregates, including but not limited to those disclosed in, for example, U.S. Pat. Nos. 6,890,868 or 6,803,262.

In particular embodiments, the semiconductor composition of the present disclosure comprises a polythiophene having the structure of Formula (I):

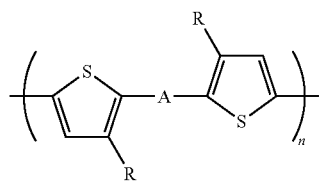

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000. The polythiophene of Formula (I) is a homopolymer and is capable of forming polymer aggregates in the liquid.

The term "alkyl" refers to a radical composed entirely of carbon atoms and hydrogen atoms which is fully saturated. The alkyl radical may be linear, branched, or cyclic.

The term "alkylene" refers to a radical composed entirely of carbon atoms and hydrogen atoms, and having the ability to form a single bond with two different non-hydrogen atoms. An alkylene radical has the formula —C$_n$H$_{2n}$—.

The term "alkenyl" refers to a radical composed entirely of carbon atoms and hydrogen atoms which contains at least one carbon-carbon double bond that is not part of an aryl or heteroaryl structure. The alkenyl radical may be linear, branched, or cyclic.

The term "alkynyl" refers to a radical composed entirely of carbon atoms and hydrogen atoms which contains at least one carbon-carbon triple bond.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). Exemplary aryl groups include phenyl, biphenyl, and fluorenyl.

The term "arylene" refers to an aromatic radical having the ability to form a single bond with two different non-hydrogen atoms. An exemplary arylene is phenylene (—C$_6$H$_4$—).

The term "alkoxy" refers to an alkyl radical which is attached to an oxygen atom, i.e. —O—C$_n$H$_{2n+1}$.

The term "heteroatom-containing group" refers to a cyclic radical containing at least one heteroatom in a ring of the cyclic radical. The cyclic radical may be aromatic or non-aromatic. The heteroatom is generally nitrogen, oxygen, or sulfur.

The term "substituted" refers to at least one hydrogen atom on the named radical being substituted with another functional group, such as halogen, —CN, —NO$_2$, —COOH, or —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl, alkylene, alkenyl, or alkynyl group may also be substituted with an aryl group. An exemplary substituted alkenyl group is phenylethenyl (—CH=CH—C$_6$H$_5$). An exemplary substituted alkynyl group is phenylethynyl (—C≡C—C$_6$H$_5$). An aryl, arylene, or heteroatom-containing group may also be substituted with alkyl or alkoxy. Exemplary substituted aryl groups include methylphenyl and methoxyphenyl. Exemplary substituted arylene groups include methylphenylene and methoxyphenylene.

Generally, the alkyl, alkylene, alkenyl, alkynyl, and alkoxy groups each independently contain from 1 to 30 carbon atoms, but in particular embodiments may have from 2 to 10 carbon atoms. Similarly, the aryl and arylene groups independently contain from 6 to 30 carbon atoms. In embodiments, n is from about 5 to about 5,000.

The term "divalent linkage" refers to any moiety which is able to form a single bond with two different non-hydrogen atoms, joining those two different atoms together. Exemplary divalent linkages include —O—, —NH—, alkylene, and arylene.

The divalent linkage A forms a single bond to each of the two thienyl moieties in Formula (I). Exemplary divalent linkages A include:

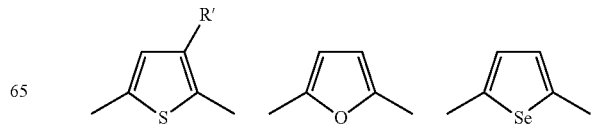

-continued

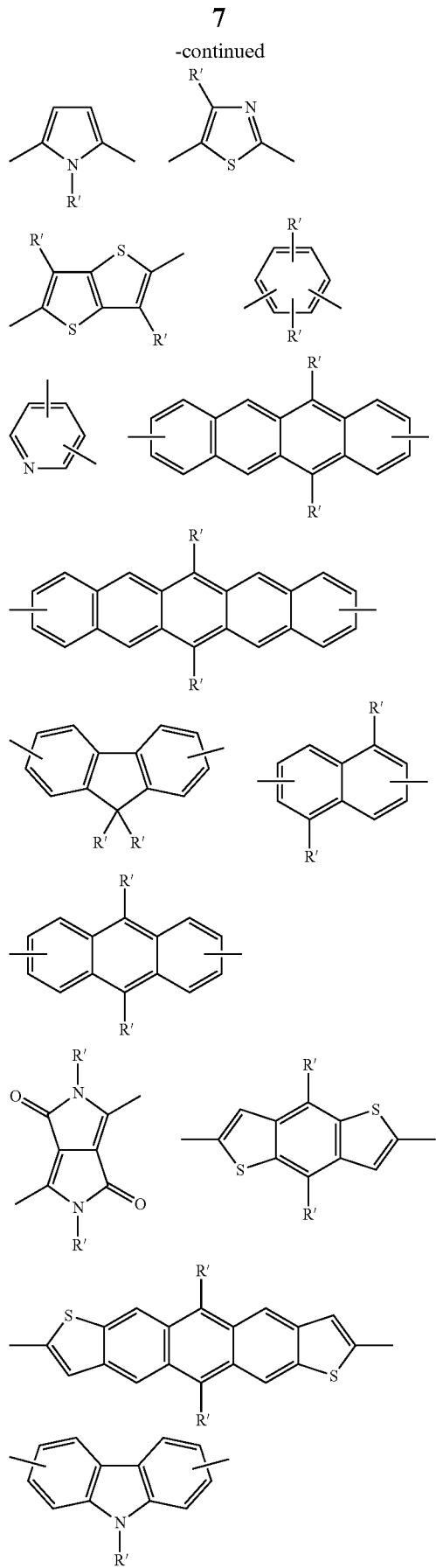

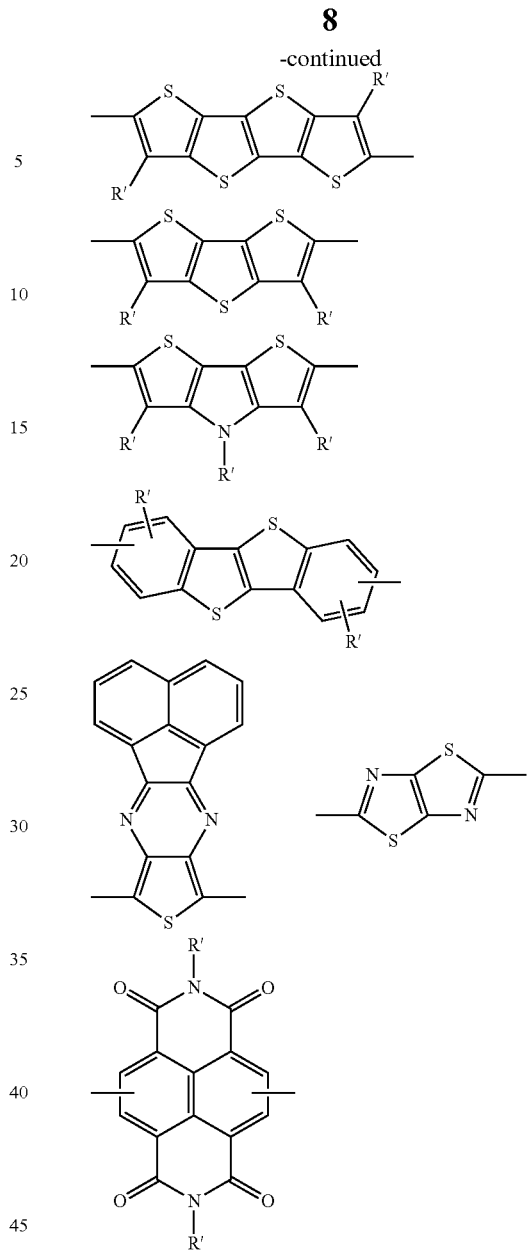

and combinations thereof, wherein each R' is independently selected from hydrogen, alkyl, substituted alkyl, aryl, substituted aryl, alkoxy or substituted alkoxy, a heteroatom-containing group, halogen, —CN, or —NO₂. One or more of these moieties may be present in divalent linkage A. In addition, one or more of a particular moiety may be present in divalent linkage A.

It should be noted that the divalent linkage A will always be different from the two thiophene monomers shown in Formula (I); in other words, Formula (I) will not reduce to being a polythiophene made from only one moiety. In particular embodiments, A is a thienyl moiety which is different from that of the two thiophene moieties shown in Formula (I). For example, R and R' are not the same when A is a thienyl moiety.

In specific embodiments of Formula (I), R is alkyl having from about 6 to about 25 carbon atoms. In some embodiments, the polythiophene may have the structure of Formula (II):

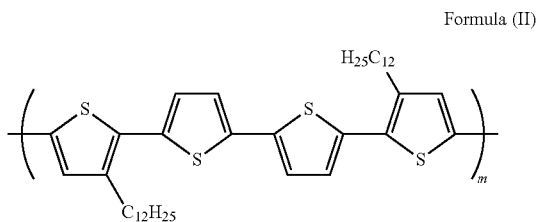

Formula (II)

wherein m is from 2 to about 2,500. The polythiophene may be referred to as PQT-12.

The semiconductor composition also comprises carbon nanotubes. Carbon nanotubes are an allotrope of carbon. They take the form of cylindrical carbon molecules and have novel properties that make them useful in a wide variety of applications in nanotechnology, electronics, optics, and other fields of meterials science. Carbon nanotubes exhibit extraordinary strength, unique electrical properties, and efficient heat conductor properties. The diameter of a nanotube is small, typically on the order of from about one-half nanometer to about a few nanometers. The length of a nanotube is typically larger, sometimes up to several millimeters. In other words, the carbon nanotubes may have a high aspect ratio, i.e. ratio of length to diameter.

The carbon nanotubes may be single-wall carbon nanotubes, double-wall carbon nanotubes, or multi-wall carbon nanotubes. A single-wall carbon nanotube is a cylinder formed by joining together the edges of a rectangular graphene sheet. A multi-wall carbon nanotube is composed of a number of cylindrical carbon nanotubes having different diameters, which are formed concentrically around each other. The carbon nanotubes can have any suitable length and diameter.

In embodiments, the carbon nanotubes are single-wall carbon nanotubes (SWCNTs). The SWCNTs have a diameter from about 0.5 nanometers to about 2.5 nanometers, including from about 0.7 to about 2.5 nm. In some specific embodiments, the SWCNTs may have a diameter from about 0.7 to 1.2 nm, or from about 0.7 to about 1.0 nm. The SWCNTs may have a length from about 0.1 to about 10 micrometers, including from about 0.5 to about 5 micrometers, from about 0.5 to about 2.5 micrometers, or from about 0.7 to about 1.5 micrometers. The aspect ratio of the SWCNTs may be from about 500 to about 10,000, including from about 500 to 5,000, or from 500 to 1500. These sentences should not be construed as requiring that all nanotubes have the same diameter, length, or aspect ratio. Rather, the nanotubes may have differing diameters, lengths, or aspect ratios within the listed distribution ranges. In specific embodiments, the carbon nanotubes are single-wall semiconducting carbon nanotubes.

The carbon nanotubes may be surface-modified carbon nanotubes. The surface modifying group can be attached on the wall or at the ends of the carbon nanotubes. The surfaces of the carbon nanotubes can be modified in two ways: non-covalent attachment and covalent attachment.

In embodiments, the surface-modified carbon nanotubes may be represented by the following formula:

wherein CNT represents the carbon nanotube, $R_1$ is a linking group selected from ester (—COO—) and amide (—CONH—); and $R_2$ is a conjugated group, a non-conjugated group, a small molecular group, an inorganic material, and combinations thereof. The degree of surface modification may vary from about one group per carbon nanotube to about one thousand groups per carbon nanotube.

The surfaces of the carbon nanotubes may be modified with a conjugated group, a non-conjugated group, an inorganic material, and combinations thereof.

Exemplary conjugated groups may include thiophene-based oligomers, pyrenyl, fluorenyl, carbazolyl, triarylamine, and phenyl. The conjugated group can be covalently bonded directly to the surface of the carbon nanotubes or through a linking group, such as amide or ester.

Exemplary non-conjugated groups may include alkyl, alkoxy, cyano, nitro, urethane, styrene, acrylate, amide, imide, ester, and siloxanes. Also included are non-conjugated groups comprising an acidic moiety, selected from the group consisting of carboxylic acid, sulfonic acid, phosphinic acid, sulfuric acid, nitric acid, phosphoric acid, and the like. In specific embodiments, the surface-modified carbon nanotubes are modified with carboxylic acid, sulfuric acid, and nitric acid. The carbon nanotube-supported acid can dope a semiconductor, particularly p-type semiconductor, to enhance conductivity of the semiconductor layer and thus the field-effect mobility of the transistors.

In specific embodiments, the inorganic material may be conducting or semiconducting. Exemplary inorganic materials include metals and metal oxides such as gold, silver, copper, nickel, zinc, cadmium, palladium, platinum, chromium, aluminum, ZnO, ZnSe, CdSe, $Zn_aIn_bO_c$ (where a, b, and c are integers), GaAs, $ZnO.SnO_2$, $SnO_2$, gallium, germanium, tin, indium, indium oxide, indium tin oxide, and the like. The inorganic material may homogenously cover the surface of the carbon nanotubes or be in nanoparticle form on the surface of the carbon nanotubes. In specific embodiment, the surface-modified carbon nanotubes are modified with nanoparticles selected from the group consisting of gold, silver, nickel, copper, ZnO, CdSe, $Zn_aIn_bO_c$, GaAs, $ZnO.SnO_2$, $SnO_2$, and ZnSe nanoparticles.

Modifying the surface of the carbon nanotubes can enable better miscibility between the carbon nanotubes and the semi-conducting polymer (such as the polythiophene of Formula (I)). Typically, nanoparticles prefer to form aggregates, due to strong van der Waals force, so that nano-scale dispersion is difficult to achieve. The surface modification increases solubility and allows real nano-scale dispersion of the carbon nanotubes in the polythiophene. When the surface is modified with a conjugated moiety, better charge transfer occurs between the carbon nanotubes and the polythiophene semiconductor.

Carbon nanotubes can be surface modified by suitable methods. For example, a reactive site can be created on the carbon nanotubes, then an oligomer or small molecular compound can be grafted onto the nanotubes at that reactive site. Another approach involves the introduction of carboxylic acid groups onto a carbon nanotube surface via an acid treatment. For example, a mixture of sulfuric acid and nitric acid can be used to form carboxylic acid groups on the surface of a carbon nanotube. Other surface modifying groups can then react with the carboxylic acid group. Other approaches include plasma treatment or direct reaction with highly reactive chemicals such as dichlorocarbene.

In some embodiments, the carbon nanotubes are not surface modified. When dispersed with the semiconducting polymer, the semiconducting polymer can stabilize the carbon nanotubes in the liquid, for example, by wrapping on the surface of the carbon nanotubes, by forming aggregates together with the carbon nanotubes, or by any other possible mechanism. In embodiments, the property of being capable of forming polymer aggregates helps to disperse and stabilize the carbon nanotubes in the semiconductor composition. The dispersed carbon nanotubes may function as nuclei so that polymer aggregates can form around the individual carbon nanotubes. As a results, the polymer aggregates help to disperse and stabilize the carbon nanotubes in the liquid.

In the semiconductor composition and the resulting semiconducting layer, the weight ratio of the carbon nanotubes to the semiconducting polymer (such as the polythiophene of Formula (I)) may be from about 1:99 to about 50:50. Phrased another way, the weight ratio of the carbon nanotubes to the polythiophene is from about 1 wt % to about 50 wt %, based on the weight of the carbon nanotubes and the polythiophene.

In embodiments, the semiconducting polymer is less than about 5.0 wt % of the semiconductor composition, including less than about 2.0 wt % of the semiconductor composition, and less than about 1.0 wt % of the semiconductor composition. In some embodiments, the semiconducting polymer is from about 0.1 wt % to about 0.8 wt % of the semiconductor composition. The carbon nanotubes may be present in the amount of from about 1 to about 50 wt % of the total weight of the carbon nanotubes and the semiconducting polymer. Put another way, the weight ratio of carbon nanotubes to semiconducting polymer may be from about 1:99 to about 50:50. In specific embodiments, the weight ratio of carbon nanotubes to semiconducting polymer is from about 10:90 to about 50:50.

The presence of carbon nanotubes in the semiconducting layer may improve the mobility of the TFT. The carbon nanotubes are generally more conductive than the polythiophene. It is believed that the carbon nanotubes may form non-percolating arrays inside the channel. The effective channel length may thus be reduced, dramatically improving the mobility. It is also believed that the carbon nanotubes electrically connect adjacent crystal domains of the semiconductor. These connections overcome the grain boundary effect, which typically decreases mobility. In embodiments, the mobility was improved by at least 50%, including at least 100%, or at least 2 times, over the TFT device having the semiconducting polymer only.

Processes for producing the semiconductor composition are also disclosed. In particular, it has been found that to achieve both high field-effect mobility and good dispersion of the carbon nanotubes in the polythiophene, a two-step process must be used. This enhances the field-effect mobility by at least 100%, and in some embodiments by a factor of 2 to 3 times. Generally speaking, carbon nanotubes and a first semiconducting polymer are dispersed in a liquid to form a first dispersion. A second semiconductor (either semiconducting polymer or small molecule semiconductor) is then added to the first dispersion to form a loaded dispersion. The second semiconductor is then dissolved or dispersed in the loaded dispersion to form a final dispersion. At least the first semiconducting polymer is capable of forming polymer aggregates in the liquid, and typically both the first and second semiconducting polymers can form polymer aggregates in the liquid. In embodiments, the first semiconducting polymer and second semiconductor are the same. In other embodiments, any suitable small molecular semiconductor can be used to form the final semiconductor composition.

Put another way, the carbon nanotubes are dispersed in a first amount of the polythiophene in a solvent to form a first dispersion. The carbon nanotubes are stabilized by the polythiophene. Next, a second amount of the polythiophene is added to the first dispersion to form a loaded dispersion. The second amount of the polythiophene is then dispersed in the loaded dispersion to form a final dispersion. In embodiments, the polythiophene is capable of forming polymer aggregates in the liquid.

An exemplary detailed procedure is now provided. First, the mixture of the first semiconducting polymer, the carbon nanotubes, and the liquid is heated to a first elevated temperature. The first semiconducting polymer is at least partially dissolved in the liquid at the first elevated temperature. The warm mixture is then lowered to a first lower temperature and probe-sonicated to form the first dispersion. The sonication can be conducted prior to, during, or after lowering the temperature to the first lower temperature. While lowering the temperature, the semiconducting polymer forms polymer aggregates at the first lower temperature, and the carbon nanotubes are dispersed and stabilized with the semiconducting polymer and the polymer aggregates. The second semiconductor is then added to the first dispersion to form a loaded dispersion. The loaded dispersion is optionally heated to a second elevated temperature, where the second semiconductor is at least partially dissolved in the liquid at the second elevated temperature. The loaded dispersion is lowered to a second lower temperature (which is lower than the second elevated temperature) and bath sonicated to form the final dispersion. In some embodiments, the first elevated temperature is the same as the second elevated temperature. In other embodiments, the first elevated temperature is higher than the second elevated temperature by 5 to about 100 degree C., including 10 to about 50 degree C. In some embodiments, the first lower temperature is below room temperature, and the second lower temperature is room temperature. In other embodiments, both the first and the second lower temperatures are below room temperature. After being lowered to the second lower temperature, the composition is brought to room temperature.

In embodiments, the first elevated temperature is from about 40° C. to about 180° C., including from about 60° C. to about 150° C. or from about 60° C. to about 120° C. The second elevated temperature is from about 30° C. to about 150° C., including from about 40° C. to about 120° C. or from about 60° C. to about 100° C. The first lower temperature is from about −25° C. (minus 25° C.) to about 15° C., including from about −10° C. (minus 10° C.) to about 5° C. or around 0 degree C. The second lower temperature is from about −25° C. (minus 25° C.) to about 35° C., including from about −10° C. (minus 10° C.) to about 25° C. or from about 0° C. to about 25° C.

The weight ratio of the carbon nanotubes to the semiconducting polymer in the first dispersion may be from about 1 wt % to about 50 wt %, based on the weight of the polymer and the carbon nanotubes. The carbon nanotubes can be dispersed very well in a polythiophene solution and at a very high loading, i.e. close to a 1:1 weight ratio. This first dispersion can be achieved by probe sonication, and results in a very stable dispersion which will not precipitate for weeks. The first dispersion may also be referred to as a stabilized dispersion. Having a highly stabilized dispersion before adding the second amount of the polythiophene is critical. One advantage of this method is that the first dispersion can be used for long-term storage prior to use in forming a semiconducting layer.

The weight ratio of the carbon nanotubes to the first and second semiconducting polymers in the loaded dispersion may be from about 1:99 to about 20:80. The loaded dispersion can be formed by adding a second amount of polythiophene to the first dispersion.

At least two different ways of adding the second amount of polythiophene are contemplated. The second amount of the polythiophene can be added into a solvent and dispersed to form a second dispersion. The loading of the polythiophene in the second dispersion, relative to the weight of the entire second dispersion, should be greater than the loading of the polythiophene in the first dispersion, relative to the weight of the entire first dispersion. Put another way, the second dispersion should have a high concentration of polythiophene compared to the first dispersion. The first dispersion and the second dispersion are then combined to form the loaded dispersion. The weight ratio of carbon nanotubes to polythiophene is lower in the loaded dispersion than in the first dispersion, due to the addition of the second dispersion.

Alternatively, the second amount of the polythiophene may be added as a powder to the first dispersion. The first dispersion is then heated to dissolve the second amount of the polythiophene into the first dispersion, forming the loaded dispersion.

In embodiments, the first dispersion is formed by using a probe sonication, and the final dispersion is formed by using a bath sonication. The term "probe sonication" refers to sonication wherein a probe is inserted into a container containing the dispersion. The term "bath sonication" refers to sonication wherein the container containing the dispersion is placed into a bath, and the bath is subsequently sonicated. Probe sonication provides much greater energy/power compared to bath sonication. Put another way, for the two-step process, high power or high energy is used during the first dispersing step, while significantly lower energy/power is used during the second dispersing step.

Electronic devices comprising the semiconductor composition described above and optionally produced by the procedure described above are also disclosed. In some embodiments, the electronic devices are thin-film transistors. In other embodiments, the electronic devices are photovoltaic devices.

The semiconducting layer may be formed in an electronic device using conventional processes known in the art. In embodiments, the semiconducting layer is formed using solution depositing techniques. Exemplary solution depositing techniques include spin coating, blade coating, rod coating, dip coating, screen printing, ink jet printing, stamping, stencil printing, screen printing, gravure printing, flexography printing, and the like.

The semiconducting layer formed using the semiconductor composition can be from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes.

The performance of a TFT can be measured by mobility. The mobility is measured in units of $cm^2/V \cdot sec$; higher mobility is desired. The resulting TFT using the semiconductor composition of the present disclosure may have a field effect mobility of at least 0.1 $cm^2/N \cdot sec$, including at least 0.2 $cm^2/V \cdot sec$. The TFT of the present disclosure may have a current on/off ratio of at least $10^4$, including at least $10^5$. The TFT of the present disclosure may also have an off current (i.e. leakage current) of less than about $10^{-9}$, or less than $10^{-10}$ amperes.

A thin film transistor generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

In the present disclosure, the dielectric layer may be surface modified with a surface modifier. Exemplary surface modifiers include small molecular silane agents such as hexamethyldisilazane (HMDS) and octyltrichlorosilane (OTS-8), or polymeric modifiers such as a polysilsesquioxane, a polysiloxane, or a fluoropolymer. The semiconducting layer can be directly contacted with this modified dielectric layer surface. The contact may be complete or partial. This surface modification can also be considered as forming an interfacial layer between the dielectric layer and the semiconducting layer.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

Single wall carbon nanotubes (Bucky USA, BU-203) were added to 1,2-dichlorobenzene until a concentration of 0.1 wt % carbon nanotubes was reached. The mixture was probe ultra-sonicated at 50% power for 20 seconds at room temperature to form a dispersion. PQT-12 powder was added to the carbon nanotube dispersion until a PQT-12 concentration of 0.1 wt % was obtained. At this point, the weight ratio of carbon nanotubes to PQT-12 was 1:1. The mixture was warmed to about 80 degree C. to dissolve the PQT-12 and then probe ultra-sonicated for 20 seconds in an ice-water bath (0-5 degree C.) to produce a very stable dispersion of carbon nanotubes and PQT-12 nanoparticles. The dispersion was centrifuged for 30 minutes, and no precipitation was observed. The PQT-12 is capable of forming nano-aggregates in 1,2-dichlorobenzene solvent. It is believed that the polymer aggregates help to stabilize the carbon nanotube dispersion. This composition is referred to as the PQT-12 stabilized CNT dispersion.

The PQT-12 stabilized CNT dispersion was used to prepare a semiconductor composition by two different methods.

In the first method, a concentrated PQT-12 dispersion of 0.5 wt % PQT-12 in 1,2-dichlorobenzene was prepared. The PQT-12 stabilized CNT dispersion and the concentrated PQT-12 dispersion were then mixed at room temperature to form a final dispersion having a weight ratio (CNT:PQT-12) of 10%. The mixture was then sonicated with a bath sonicator in an ice-water bath to form a stable CNT/PQT-12 composition.

In the second method, PQT-12 powder was added directly into the PQT-12 stabilized CNT dispersion to achieve a weight ratio (CNT:PQT-12) of 10%. The dispersion was heated to about 80 degree C. to dissolve the PQT-12 powder. The mixture was then sonicated with a bath sonicator in an ice-water bath to form a stable CNT/PQT-12 composition.

Example 2

Thin-film transistors were fabricated on a silicon wafer substrate using the CNT/PQT-12 composition of Example 1 to form a semiconducting layer. N-doped silicon functioned as the gate, and a 200 nm silicon oxide layer functioned as the dielectric layer. The silicon oxide was modified with octyltrichlorosilane. The CNT/PQT-12 composition was spin coated on the wafer at 1000 rpm for 120 seconds. The deposited semiconductor composition was dried at 80° C. and annealed at 140° C. in a vacuum oven to form the semiconducting layer. Gold source and drain electrodes were evaporated on top of the semiconductor through a shadow mask.

TFTs produced with the CNT/PQT-12 semiconducting layer showed a field

Comparative Example 1

The general procedure of Example 2 was followed, except a pure PQT-12 semiconducting layer was used instead of a semiconducting layer including the composition of Example 1. The TFT with only PQT-12 exhibited mobility of about 0.1 $cm^2/V \cdot sec$, about one-third of the value achieved when the semiconductor composition includes carbon nanotubes. A comparison of Example 2 and Comparative Example 1 indicates that the inclusion of carbon nanotubes in the semiconductor composition increases mobility of devices formed therefrom.

Comparative Example 2

The general procedure of Example 1 was followed, except PQT-12 was replaced with poly(3-hexylthiophene) (P3HT). The CNT/P3HT mixture was produced after being sonicated in the bath sonicator. Precipitation was observed. The precipitation suggests that P3HT may not be as effective as PQT-12 for stabilizing the CNT dispersion. P3HT is not able to form polymer aggregates in 1,2-dichlorobenzene solvents. A comparison of Example 2 and Comparative Example 2 suggests that the particular polythiophene selected is critical to achieving stability.

Comparative Example 3

0.1 wt % carbon nanotubes was dispersed in dichlorobenzene. PQT-12 powder was added to attain a weight ratio (CNT:PQT-12) of 10%. The PQT-12 was dissolved by heating the mixture to about 80 degree C., and the mixture was probe sonicated for 20 seconds in an ice-water bath. This composition was used as a semiconductor composition in a TFT produced following the general procedure of Example 2. The fabricated devices exhibited a field effect mobility of about 0.05-0.09 cm$^2$/V·sec. A comparison of Example 2 and Comparative Example 3 illustrates that adding the polythiophene in multiple steps as disclosed herein may allow higher mobility to be achieved.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. A semiconductor composition comprising:
a liquid;
carbon nanotubes; and
semiconducting polymer aggregates,
wherein each carbon nanotube present in the composition is a single-walled semiconducting carbon nanotube.

2. The semiconductor composition of claim 1, wherein the carbon nanotubes are stabilized by the semiconducting polymer aggregates.

3. The semiconductor composition of claim 1, wherein the composition has a shelf-life greater than 1 week.

4. The semiconductor composition of claim 1, wherein the liquid comprises at least one of water, alcohol, acetate, toluene, xylene, tetrahydronaphthalene, methy-naphthalene, mesitylene, hexane, decalin, cyclohexane, chlorobenezene, dichlorobenzene, trichlorobenzene, chlorotoluene, hexafluoropropanol, perfluorodecalin, perfluorocyclohexane, and perfluorononane, acetone, methyl ethyl ketone, and mixtures thereof.

5. The semiconductor composition of claim 1, wherein the semiconducting polymer aggregates are less than 2.0 wt % of the composition, and the carbon nanotubes are from about 1 to about 50 wt % of the total weight of the semiconducting polymer aggregates and the carbon nanotubes.

6. The semiconductor composition of claim 5, wherein the weight ratio of carbon nanotubes to semiconducting polymer aggregates is from about 10:90 to about 50:50.

7. A semiconductor composition comprising:
carbon nanotubes; and
semiconductor polymer aggregates formed of a polythiophene of Formula (I):

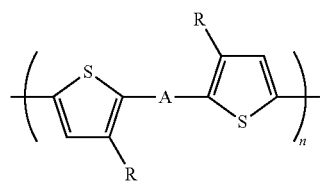

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000; and
a liquid in which the polythiophene is capable of forming the semiconducting polymer aggregates at room temperature,
wherein each carbon nanotube present in the composition is a single-walled semiconducting carbon nanotube.

8. The semiconductor composition of claim 7, wherein R is alkyl having from about 6 to about 25 carbon atoms.

9. The semiconductor composition of claim 7, wherein the weight ratio of the carbon nanotubes to the polythiophene is from about 1:99 to about 50:50.

10. The semiconductor composition of claim 7, wherein the polythiophene has the structure of Formula (II):

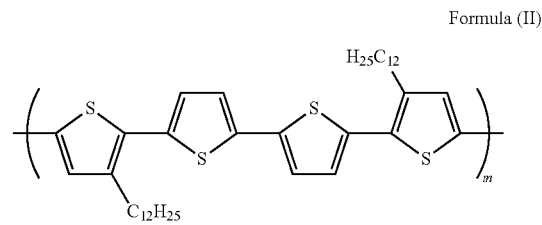

Formula (II)

wherein m is from 2 to about 2,500.

11. An electronic device comprising a semiconducting layer, the semiconducting layer including:
carbon nanotubes; and
semiconductor polymer aggregates formed of a polythiophene of Formula (I):

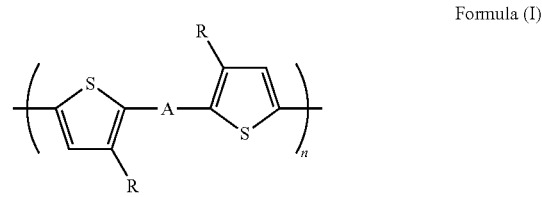

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000, the polythiophene being capable of forming the semiconducting polymer aggregates at room temperature in a liquid,
wherein each carbon nanotube is a single-walled semiconducting carbon nanotube.

12. The electronic device of claim 11, wherein the carbon nanotubes are present in the composition in an amount of at least 10 wt % of the polythiophene.

13. The electronic device of claim 11, wherein the polythiophene has the structure of Formula (II):

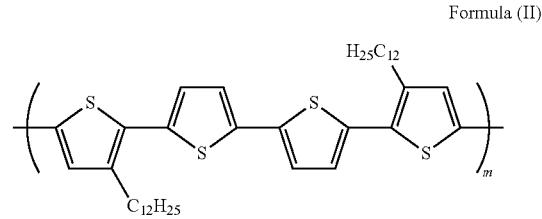

Formula (II)

wherein m is from 2 to about 2,500.

* * * * *